United States Patent [19]

Councilman et al.

[11] 4,342,971
[45] Aug. 3, 1982

[54] CONTINUOUSLY VARIABLE SURFACE ACOUSTIC WAVE DELAY LINE

[75] Inventors: Clyde L. Councilman; Larry D. Alter, both of St. Petersburg, Fla.

[73] Assignee: E-Systems, Inc., Dallas, Tex.

[21] Appl. No.: 221,279

[22] Filed: Dec. 30, 1980

[51] Int. Cl.³ .................... H03H 9/42; H03H 9/68; H03H 9/38

[52] U.S. Cl. .................................. 333/152; 333/150

[58] Field of Search .............................. 333/150–155, 333/193–196; 310/26, 313 R, 313 A, 313 B, 313 C, 313 D; 331/107 A

[56] References Cited

U.S. PATENT DOCUMENTS

| | | | |
|---|---|---|---|
| 3,233,749 | 2/1966 | Devol | 310/26 X |
| 3,723,915 | 3/1973 | Adler et al. | 333/152 |
| 3,916,348 | 10/1975 | Toda et al. | 333/155 |
| 3,978,731 | 9/1976 | Reeder et al. | 310/313 B X |

Primary Examiner—Marvin L. Nussbaum
Attorney, Agent, or Firm—Robert V. Wilder; Albert M. Crowder, Jr.

[57] ABSTRACT

A surface acoustic wave variable time delay includes a surface acoustic wave device (10) which is secured within a housing (30). The device (10) is provided with an input transducer (12) and an output transducer (16) which are respectfully connected to input lines (14) and output lines (18). An electrostrictive element (20) is secured within housing (30) between an end of device (10) and an interior wall (34) of housing (30). A control signal is applied to electrodes (22, 24) connected to element (20) to vary the size thereof. Element (20) applies a mechanical force to the surface acoustic wave device (10) to alter the distance between the input transducer (12) and output transducer (16) to thereby control the delay time between the signal supplied to the input lines (14) and the output signal at the output lines (18).

8 Claims, 3 Drawing Figures

CONTINUOUSLY VARIABLE SURFACE ACOUSTIC WAVE DELAY LINE

TECHNICAL FIELD

The present invention pertains to an electronic delay line and in particular to such a line utilizing a surface acoustic wave device.

BACKGROUND ART

In radar systems with adaptive or other types of antenna arrays and in many types of signal processing applications there exists a need for a variable electronic delay line. Such delay lines have heretofore been fabricated using for example lengths of coaxial cable and discretely tapped surface acoustic wave devices. These delay lines, however, provide only integral delay steps rather than continuous variability.

In numerous applications there exists a need for a continuously variable delay line which has a relatively wide bandwidth over a substantial time delay period.

DISCLOSURE OF THE INVENTION

The present invention comprises a continuously variable surface acoustic wave delay line. The delay line includes a surface acoustic wave device which has an input transducer fabricated on a surface of the device. The input transducer receives an input signal and applies the input signal to the surface acoustic wave device. An output transducer is mounted on the surface of the surface acoustic wave device for receiving the signal propagated along the surface of the acoustic wave device. Apparatus is provided for applying mechanical force to the surface acoustic wave device in response to a control signal to alter the distance between the transducers. The change in distance controls the propagation time of the signal between the transducers to thereby provide a variable delay line.

BRIEF DESCRIPTION OF THE DRAWINGS

For a more complete understanding of the present invention and the advantages thereof, reference is now made to the following description taking into conjunction with the accompanying drawings in which.

DETAILED DESCRIPTION OF THE INVENTION

Figure 1:
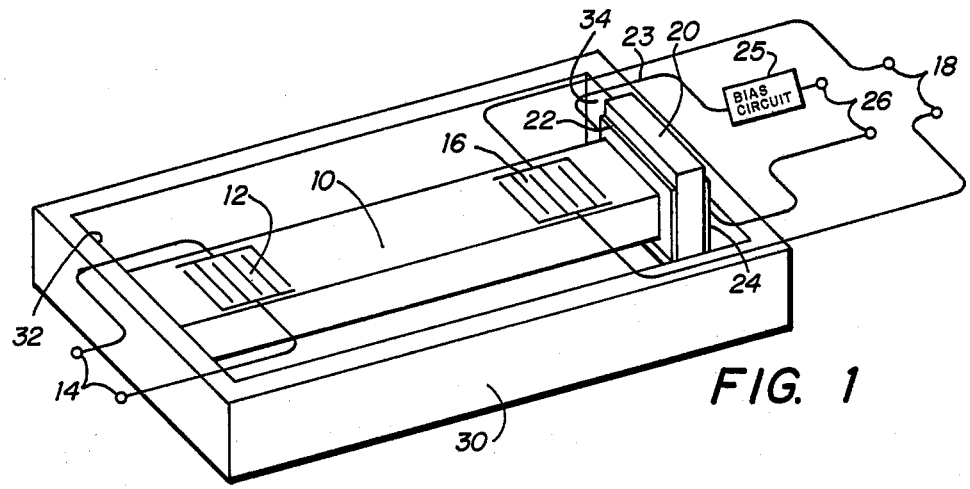
FIG. 1 is a perspective view of a surface acoustic delay line with an electrostrictive compression element.

A surface acoustic wave device delay line in accordance with the present invention is illustrated in FIG. 1. A surface acoustic wave device 10 is an elongate, piezoelectric crystal or any other structure capable of supporting a surface acoustic wave. An interdigitated input transducer 12 is fabricated on the upper surface of device 10 at one end thereof. The input transducer 12 is connected through input lines 14 for receiving an RF input signal. An output transducer 16 also comprises a set of interdigitated fingers and is fabricated on the surface of device 10 to receive surface waves propagated along the surface of the device. The output transducer 16 is connected to output lines 18 for conveying the RF signal which is time delayed from the input signal.

An electrostrictive element 20 which is, for example, properly doped barium titanate is positioned contiguous the end of the surface acoustic wave device 10. Electrodes 22 and 24 are connected to each end of the element 20. Electrode 20 is connected to a bias circuit 25 through a line 23. The output of circuit 25 and electrode 24 is connected to lines 26 for receiving a control signal.

The surface acoustic wave device 10 together with the electrostrictive element 20 is located within a rigid housing 30. The device 10 and element 20 are firmly fixed between interior walls 32 and 34 of housing 30.

Referring further to FIG. 1 an input RF signal is applied to input lines 14 wherein the input transducer 12 applies the input signals as surface waves to the surface of device 10. The surface waves travel from input transducer 12 to output transducer 16 which converts the surface waves to electrical signals that are transmitted through lines 18. The output signal on line 18 is delayed from the input signal on line 14 by the propagation time between transducers 12 and 16.

The bias circuit 25 applies a bias voltage to the element 20. The electrostrictive element 20 responds to the control signal supplied through line 26 and the bias voltage to change the size of the element. In so doing the element 20 applies a mechanical force to compress the surface acoustic wave device 10. The bias voltage is of sufficient amplitude to insure that direction of force applied to device 10 remains the same despite variations in the magnitude of the force drive to the control signal. As device 10 is variably compressed the propagation time between transducers 12 and 16 is changed thereby changing the delay time between the input and output signals. The control signal applied through line 26 thus alters the size of element 20 and therefore varies the propagation time between the transducers. The time delay between the input and output signals is thus proportional to the control signal and is thereby continuously variable.

Figure 2:
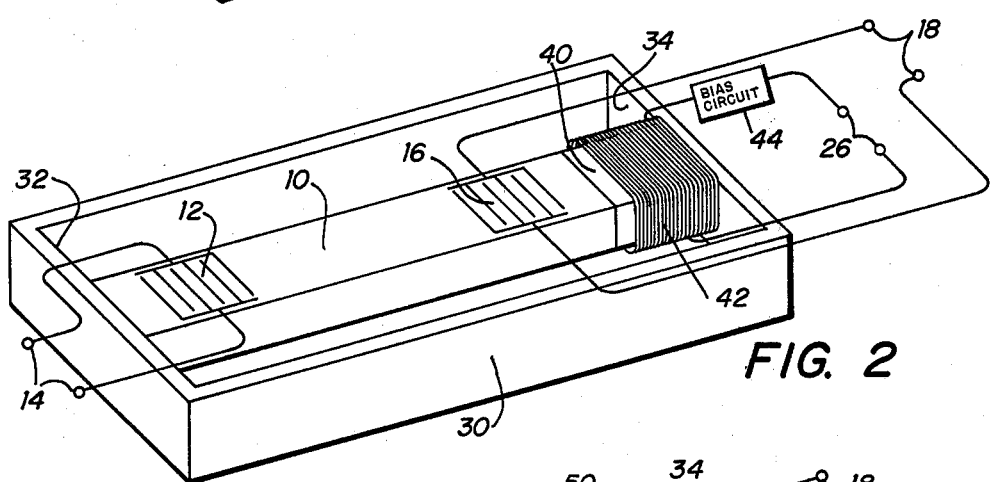
FIG. 2 is a perspective view of a surface acoustic delay line with a magnetostrictive compression element.

Referring now to FIG. 2 there is shown a second embodiment of the present invention wherein the electrostrictive element 20 has been replaced with a magnetostrictive element. The surface acoustic wave device, transducers, signal lines, control lines and housing are the same as shown in FIG. 1. A magnetostrictive element 40 such as, PERMANDUR or any of several nickel iron alloys or certain other materials having magnetostrictive properties, is securely placed in the housing 30 between the device 10 and the interior wall 34. A coil 42 is wound about element 40 and is connected to the control lines 26 through a bias circuit 44. When a control signal is applied to lines 26 the coil 42 produces a magnetic field which is applied to the magnetostrictive element 40. The longitudinal dimension of element 40 is a function of the magnetic field applied thereto. The bias circuit 44 supplies a bias current to the coil 42 to produce a biasing magnetic field such that a bias force is applied to device 10. The bias force insures that the direction of force applied to device 10 remains the same despite variations in amplitude. Therefore, as element 40 changes in length the surface acoustic wave device 10 is variably compressed to change the distance between the input transducer 12 and the output transducer 16. This action permits the time delay between the input and output lines, 14 and 18 to be continuously varied as a function of the control signal applied to lines 26.

Figure 3:
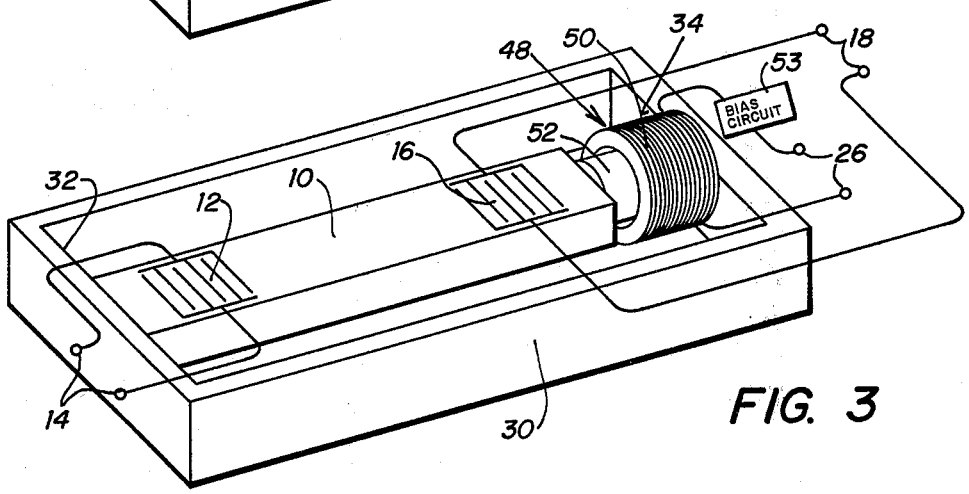
FIG. 3 is a perspective view of a surface acoustic wave device having a solenoid with an armature which provides compression to the surface acoustic wave device.

A further embodiment of the present invention is illustrated in FIG. 3. The surface acoustic wave device, transducers, input and output lines, control lines and housing are the same as shown in FIG. 1. The electrostrictive element 20 is, however, not included. In place of the electrostrictive element there is provided a solenoid 48 having a coil 50 and an armature 52. The armature 52 is movable in response to the current through coil 50. A bias circuit 53 provides a bias current through coil 50. A control signal is applied through lines 26 to supply current through coil 50 and thereby apply a varying force to the armature 52. The armature 52 is positioned such that it is securely in contact with the surface acoustic wave device 10. The bias current from circuit 53 provides a bias force to maintain a constant direction of force on device 10. Therefore, when a force is applied to armature 52, the force is transmitted to the device 10 to alter the distance between the input transducer 12 and the output transducer 16. Thus, as described above, the time delay between the input line 14 and the output line 18 is a function of the control signal which is applied to the control lines 26.

In a typical application of the present invention an input signal at a frequency of 300 mhz is applied to the input lines 14. The propagation time between the input and output transducers varies between 10 and 10.01+ microseconds as a function of the control signal applied to lines 26. The time delay is continuously variable depending upon the amplitude of the control signal.

In summary, the present invention comprises a surface acoustic wave device having input and output transducers and a control mechanism which applies a mechanical force to the surface acoustic wave device as a function of the control signal. The force applied to the surface acoustic wave device alters the distance between the input and output transducers to thereby control the propagation time between the transducers which in turn controls the signal time delay between the input and output lines.

Although several embodiments of the invention have been illustrated in the accompanying drawings and described in the foregoing detailed description, it will be understood that the invention is not limited to the embodiments disclosed, but is capable of numerous rearrangements, modifications and substitutions without departing from the scope of the invention.

We claim:

1. A continuously variable surface acoustic wave delay line comprising:
    (a) a rigid housing;
    (b) a surface acoustic wave device positioned within said housing and having a first edge thereof adjacent a first interior wall of said housing;
    (c) an input transducer on a surface of said device, said input transducer connected to receive an input signal and apply the signal to the device;
    (d) an output transducer positioned on said surface spaced apart from said input transducer, said output transducer for receiving said signal from said device and for generating an output signal therefrom;
    (e) an electrostrictive element positioned within said housing between a second edge of said device opposite said first edge and a second interior wall of said housing opposite said first interior wall; and
    (f) means responsive to a control signal for applying an electric field to said electrostrictive element to alter the size thereof and thereby apply a mechanical force to said device to control the propagation time of said signal between said transducers.

2. The delay line recited in claim 1 wherein said surface acoustic wave device is elongate and said transducers and said electrostrictive element are colinear.

3. The delay line recited in claim 1 including means for supplying a bias signal to said electrostrictive element to apply a fixed bias force to said surface acoustic wave device.

4. A continuously variable surface acoustic wave delay line, comprising:
    (a) a rigid housing;
    (b) a surface acoustic wave device positioned within said housing and having a first edge thereof adjacent a first interior wall of said housing;
    (c) an input transducer positioned on a surface of said device, said input transducer connected to receive an input signal and apply the signal to the device;
    (d) an output transducer positioned on said surface spaced apart from said input transducer, said output transducer for receiving said signal from said device and for generating an output signal therefrom;
    (e) a magnetostrictive element positioned within said housing between a second edge of said device opposite said first edge and a second interior wall of said housing opposite said first interior wall; and
    (f) means responsive to a control signal for generating a magnetic field in the region of said magnetostrictive element to alter the size of said element and thereby apply a mechanical force to said device to control the propagation time of said signal between said transducers.

5. The delay line recited in claim 4 wherein said surface acoustic wave device is elongate and said transducers and said magnetostrictive element are colinear.

6. The delay line recited in claim 4 wherein said means for generating a magnetic field comprises a coil wound about said magnetostrictive element and connected to receive said control signal.

7. The delay line recited in claim 4 including means for applying a biasing magnetic field to said magnetostrictive element.

8. A continiuously variable surface acoustic wave delay line comprising:
    (a) a rigid housing;
    (b) an elongate surface acoustic wave device positioned within said housing and having a first edge thereof adjacent a first interior wall of said housing;
    (c) an input transducer on a surface of said device, said input transducer connected to receive an input signal and apply the signal to said device;
    (d) an output transducer on said surface for receiving the signal applied to said device; and
    (e) a solenoid connected to receive a control signal and including an armature, said armature and said transducers being essentially co-linear, which is driven in response to the control signal, the armature positioned to apply a mechanical force to said device to control the propagation time of said signal between said transducers.

* * * * *